US010921758B2

(12) United States Patent
Allmaras et al.

(10) Patent No.: US 10,921,758 B2
(45) Date of Patent: Feb. 16, 2021

(54) METHOD AND ARRANGEMENT FOR CONTROLLING A TECHNICAL SYSTEM HAVING MULTIPLE FUNCTIONALLY LINKED SYSTEM COMPONENTS

(71) Applicant: Siemens Aktiengesellschaft, Munich (DE)

(72) Inventors: Moritz Allmaras, Munich (DE); Mathias Oppelt, Nuremberg (DE); Andreas Pirsing, Sommerfeld (DE); Roland Rosen, Seefeld (DE); Tim Schenk, Landshut (DE); Annelie Sohr, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 27 days.

(21) Appl. No.: 16/299,829

(22) Filed: Mar. 12, 2019

(65) Prior Publication Data

US 2019/0286078 A1  Sep. 19, 2019

(30) Foreign Application Priority Data

Mar. 15, 2018 (EP) .................................... 18161986

(51) Int. Cl.
*G05B 13/04* (2006.01)
*G05B 23/02* (2006.01)
(Continued)

(52) U.S. Cl.
CPC ........... *G05B 13/042* (2013.01); *G05B 17/02* (2013.01); *G05B 23/02* (2013.01); *G06F 30/20* (2020.01)

(58) Field of Classification Search
CPC .................................................. G05B 13/042
(Continued)

(56) References Cited

U.S. PATENT DOCUMENTS 8,055,358 B2 * 11/2011 Blevins ................ G05B 13/022
700/28
2007/0011331 A1 * 1/2007 Morimoto ........... H04L 67/1008
709/226

(Continued)

FOREIGN PATENT DOCUMENTS

GB           2393528 A    3/2004
WO    WO 2007067645 A2   6/2007

*Primary Examiner* — Suresh Suryawanshi
(74) *Attorney, Agent, or Firm* — Schmeiser, Olsen & Watts LLP

(57) ABSTRACT

To control a technical system having multiple system components, multiple functional modules access a common data model. The functional modules in this case include an interface module, a simulation module and an output module. The data model includes data components associated with the system components and simulation model data for a simulation model of the technical system. The functional modules are actuated by a flow controller, wherein the flow controller and a respective functional module have functional-module-specific selection data transmitted between them that the respective functional module takes as a basis for accessing model data of the data model. The interface module continually captures operating data of the technical system and stores them in the data model by means of selection-data-specific access.

14 Claims, 1 Drawing Sheet

Figure 1:
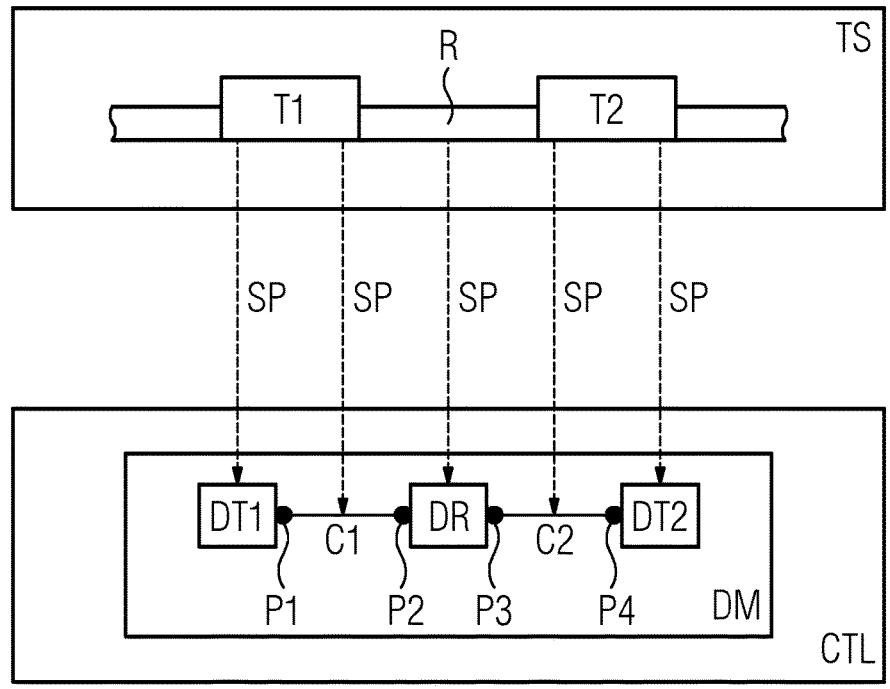

(51) Int. Cl.
*G05B 17/02* (2006.01)
*G06F 30/20* (2020.01)

(58) Field of Classification Search
USPC .......................................... 700/29
See application file for complete search history.

(56) References Cited

U.S. PATENT DOCUMENTS

| | | |
|---|---|---|
| 2007/0129917 A1 | 6/2007 | Blevins et al. |
| 2008/0243283 A1* | 10/2008 | Nakashima ............ G05B 17/02 700/97 |
| 2011/0131017 A1 | 6/2011 | Cheng et al. |
| 2013/0066604 A1* | 3/2013 | Ruehl ..................... G06F 30/20 703/2 |
| 2013/0204587 A1 | 8/2013 | Cheng et al. |
| 2013/0253897 A1* | 9/2013 | Kanbe .................... G05B 11/01 703/13 |
| 2014/0156092 A1* | 6/2014 | Groganz ............... G05B 13/042 700/286 |
| 2015/0134291 A1* | 5/2015 | Fricke ................... G01M 17/00 702/113 |
| 2016/0172900 A1* | 6/2016 | Welch, Jr. ............... H02J 9/062 307/64 |
| 2017/0091347 A1* | 3/2017 | Geipel ............... G05B 19/0426 |
| 2019/0033850 A1* | 1/2019 | B R .................... G05B 23/0221 |

\* cited by examiner

METHOD AND ARRANGEMENT FOR CONTROLLING A TECHNICAL SYSTEM HAVING MULTIPLE FUNCTIONALLY LINKED SYSTEM COMPONENTS

CROSS-REFERENCE TO RELATED APPLICATIONS

This application claims priority to European application No. 18161986.7, having a filing date of Mar. 15, 2018, the entire contents of which are hereby incorporated by reference.

FIELD OF TECHNOLOGY

The following relates to controlling a technical system having multiple functionally linked system components.

BACKGROUND

When controlling complex technical systems, in particular infrastructure networks, such as e.g. water mains, power mains, logistics networks or process networks, and production installations, process-engineering installations or power stations, it is normally desirable to optimize a system response in consideration of prescribed criteria. For this purpose, there is frequently provision for assistance functions that are integrated directly into the control engineering and the control sequence. This integration is often designed very specifically for the respective control engineering or the respective control sequence. Numerical evaluations and optimizations, which frequently operate iteratively and on complex data structures, can be modeled for the most part only in simplified fashion on account of the the specific tie with the particular control engineering.

Known examples of specific control optimizations of this kind are what are known as MPC (Model Predictive Control) controllers. Such an MPC controller detects sensor signals of the technical system to be controlled, performs numerical optimization on a normally highly simplified data model of the technical system and outputs manipulated variables for controllable components of the technical system as the result of the optimization.

SUMMARY

An aspect relates to a method and an arrangement for controlling a technical system that can be used more flexibly.

To control a technical system, in particular an infrastructure network, a water mains, a power mains, a logistics network, a process network, a production installation, a process-engineering installation or a power station, that has multiple functionally linked system components, multiple independently operable functional modules access a common data model. The functional modules in this case comprise an interface module having an interface to the technical system, a simulation module and an output module. The data model comprises data components associated with the system components and accordingly linked and simulation model data for a simulation model of the technical system. The simulation model can in this case model or at least approximately reproduce a physical response of the technical system. A simulation is intended to be understood to mean in particular any ascertainment of the dynamic response on the basis of a physical model of the technical system. The functional modules are actuated by a flow controller, wherein the flow controller and a respective functional module have selection data associated with the functional module transmitted between them that the respective functional module takes as a basis for selecting for model data on the data model and for accessing the selected model data. The interface module continually captures operating data of the technical system and stores them in the data model by means of selection-data-specific access. The simulation module reads the operating data and simulation model data from the data model by means of selection-data-specific access and takes the read operating data and the simulation model data as a basis for ascertaining a dynamic response of the technical system. Simulation data about the ascertained dynamic response are stored in the data model by the simulation module by means of selection-data-specific access. The output module reads the simulation data from the data model by means of selection-data-specific access and outputs them to control the technical system.

To perform the method according to embodiments of the invention, there is provision for an arrangement for controlling the technical system, a computer program product (non-transitory computer readable storage medium having instructions, which when executed by a processor, perform actions) and a computer-readable storage medium. The arrangement can be in particular a control device, an assistance system or another device contributing to controlling the technical system.

The method according to embodiments of the invention and the arrangement according to embodiments of the invention can be performed and implemented for example by means of one or more processors, application-specific integrated circuits (ASICs), digital signal processors (DSP) and/or what are known as "Field Programmable Gate Arrays" (FPGAs).

An advantage of embodiments of the invention can be seen in particular in that the functional modules require no direct data interchange among one another. The functional modules do not need to know one another to a certain extent, which means that their reciprocal dependency can be substantially reduced. This allows embodiments of the invention to be in many cases more easily and more flexibly matched to different requirements, control purposes, application contexts and different technical systems and integrated into existing control environments and software environments.

Advantageous embodiments and developments of the invention are specified in the dependent claims.

Advantageously, the data model can be provided by virtue of an unparameterized data model with data components associated with the system components and accordingly linked being parameterized on the basis of system parameters of the system components. In this manner, the data model or the data components thereof can be instantiated by means of the system parameters based on the unparameterized data model.

Furthermore, the functional modules can be actuated by the flow controller on the basis of the selection data and/or on the basis of the link of the data components.

In particular, the functional modules can be called by the flow controller in an order that is dependent on the selection data and/or the link of the data components.

According to an advantageous embodiment of the invention, the dynamic response can be simulated in the course of operation of the technical system. In this case, the functional modules can comprise a monitoring module that takes the simulation as a basis for ascertaining a state of the technical system and outputs state data about the ascertained state to control the technical system. In particular, the monitoring module can read simulation data about the ascertained dynamic response from the data model by means of selection-data-specific access and can ascertain the state of the technical system on the basis of the read simulation data. In this manner, monitoring of different operating states and operating parameters in the course of operation of the technical system can be realized with little outlay. The simulation module can possibly be identical to or comprise the monitoring module.

Furthermore, the monitoring module can be implemented as a forecast module that takes the simulation as a basis for ascertaining a future state of the technical system and outputs state data about the ascertained future state to control the technical system. As a result, future operating states and operating parameters can be forecast in the course of operation of the technical system with little outlay. The simulation module can possibly be identical to or comprise the forecast module.

According to a further advantageous embodiment of the invention, the functional modules can comprise an optimization module. The optimization module can generate different control actions for the technical system, ascertain for the different control actions a respective dynamic response of the technical system, induced thereby, on the basis of the simulation model, and output a control action from the generated control actions that optimizes the induced dynamic response to control the technical system. Such a control action is frequently also referred to as an action, as an action variable or as a controlled variable and specified or represented by control data. Optimization is also intended to be understood in this case to mean a deliberate approach to an optimum.

Furthermore, the flow controller can ascertain an order in which functional modules are called, on the basis of a control application and/or on the basis of a temporal, spatial, logical and/or functional link or on the basis of system components, system processes or system data of the technical system and/or applicable data components and/or data records of the data model. The control application provided for can be in particular monitoring of the technical system, forecast of future states of the technical system, optimization of the control actions for the technical system or another control purpose.

Further, the functional modules can comprise a sensor module that stores sensor data relating to the technical system in the data model by means of selection-data-specific access. The stored sensor data can then be read from the data model by another functional module by means of selection-data-specific access and processed further.

As well as that, the functional modules can comprise an evaluation module that reads data to be evaluated as part of the control from the data model by means of selection-data-specific access and evaluates said data and stores an evaluation result in the data model by means of selection-data-specific access. In this manner, a multiplicity of different data-analytical and/or non-model-based functions can be integrated into the inventive concept in a modular manner.

Furthermore, one or more of the functional modules each can run as a microservice in an edge computing environment and/or cloud computing environment. In this manner, many advantages of said environments can be used for controlling the technical system.

According to an advantageous development of embodiments of the invention, application information specifying a control application can be read in. The read-in application information can then be taken as a basis for, in each case, restructuring the data model, modifying the selection data and/or actuating the functional modules by means of the flow controller. As already mentioned above, the control application provided for in this case could be in particular monitoring of the technical system, forecast of future states of the technical system, optimization of control actions for the technical system or another control purpose. In this manner, embodiments of the invention can be flexibly matched to different control applications.

BRIEF DESCRIPTION

Figure 2:
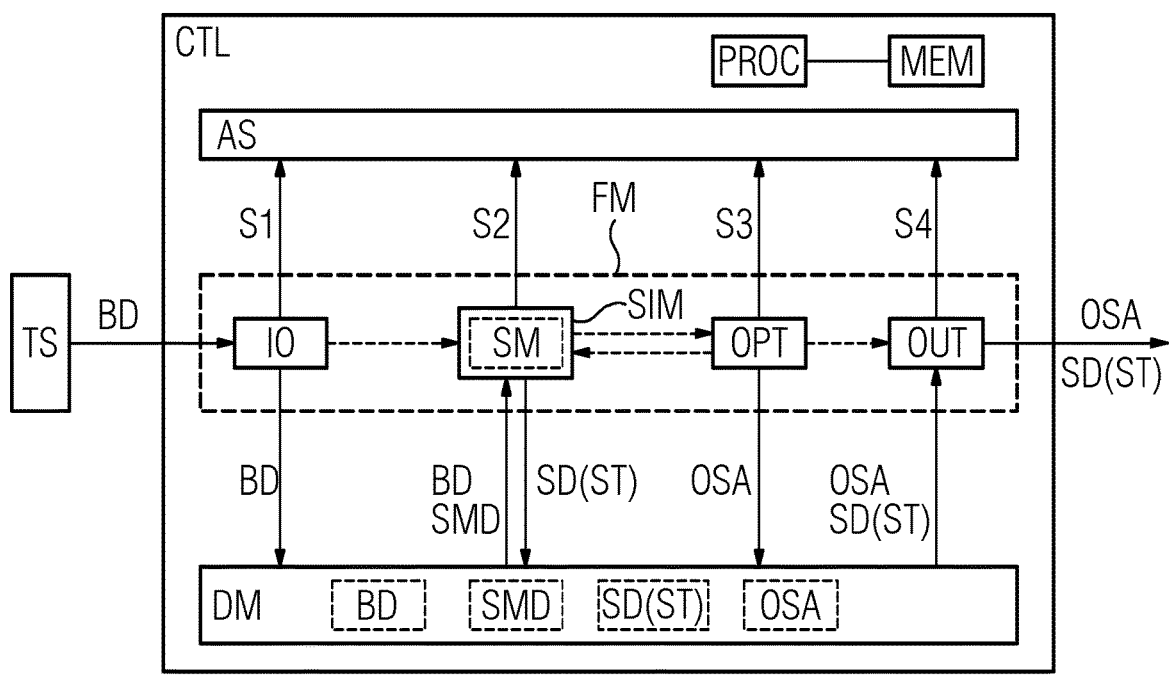

Some of the embodiments will be described in detail, with references to the following Figures, wherein like designations denote like members, wherein:

FIG. 1 shows part of a water mains as a technical system to be controlled and the mapping thereof onto a data model for controlling the water mains; and FIG. 2 shows an arrangement according to embodiments of the invention for controlling a technical system.

DETAILED DESCRIPTION

FIG. 1 shows, by way of example, part of a water mains as a technical system TS to be controlled and the mapping thereof onto a component- and connection-oriented data model DM in a schematic depiction. The data model DM is part of a control device CTL for controlling the water mains TS. As an alternative or in addition to the water mains TS, the technical system provided for can also be a different infrastructure network, such as e.g. a power mains, a logistics network or a process network, or a production installation, a process-engineering installation, a power station or a combination of these.

The technical system TS has a network infrastructure that comprises a respective multiplicity of different functionally linked and technically interacting system components, such as e.g. water pipes, electric cables, power stations, loads, production robots, conveyor belts or machine tools. The system components can in this case be linked in particular by a flow of material, flow of energy and/or flow of data.

The water mains TS considered in the present exemplary embodiment has water tanks T1 and T2 and a water pipe R connecting the water tanks T1 and T2 as system components. As further system components, there could be provision for e.g. water pumps, loads or wastewater treatment plants.

The water mains TS is controlled by or by means of the control device CTL according to embodiments of the invention. The control device CTL can in this case be implemented wholly or in part externally to the technical system TS or as part of the technical system TS. In particular, the control device CTL can be manifested as an assistance system for assisting control of the technical system TS.

The technical system TS is represented to a certain extent by the data model DM implemented in the control device. The data model DM in this case models an actual topology and functional structure of the technical system TS, in particular of the system components, in this case T1, T2 and R, and the functional links thereof. Physical or chemical states and/or other technical parameters of the technical system TS and of the system components thereof are modeled as completely as possible by the data model DM. For this purpose, the latter comprises data components that are associated with the system components and accordingly linked for data transmission purposes and that model the structure of the technical system TS and its system components.

In the present exemplary embodiment, the system component T1 is mapped onto the data component DT1, the system component R is mapped onto the data component DR and the system component T2 is mapped onto the data component DT2.

As well as that, functional links or connections between the system components, in this case T1, T2 and R, are mapped onto corresponding data links or connections between the data components, in this case DT1, DT2 and DR.

In the present exemplary embodiment, the functional link between the water tank T1 and the water pipe R is mapped onto a data link C1 between the data components DT1 and DR, and the functional link between the water pipe R and the water tank T2 is mapped onto a data link C2 between the data components DR and DT2. The link C1 is in this case coupled to a port P1 of the data component T1 and to a port P2 of the data component DR, while the link C2 is coupled to a port P3 of the data component DR and to a port 4 of the data component DT2. The data components DT1, DT2 and DR and the data links C1 and C2 each indicate technical parameters and physical and/or chemical states of the system components T1, T2 and R and of the functional links or connections thereof.

The data model DM comprises in particular simulation model data for a simulation model of the technical system TS. The simulation model data are particular data stored in the data components for simulating the technical system TS or its system components. The data model DM is to this end structured like known P&ID models or known system simulation models, e.g. by means of component types for which parameterized instances can be produced and whose link among one another models a system structure of the technical system TS that is required for simulation.

In the present exemplary embodiment, the data model DM is provided by virtue of an initially unparameterized data model being parameterized by particular system parameters SP of the system components, in this case T1, T2 and R. The system parameters SP in this case indicate an actual structure or actual states of the technical system TS or its system components, such as e.g. a capacity of a respective water tank T1 and T2 and/or a diameter of the water pipe R. The parameterization, i.e. stipulating the particular system parameters SP characterizing the technical system TS or the system components thereof, instantiates the data model DM or its data components, in this case DT1, DR and DT2, and the links C1 and C2 thereof.

The above data structures can be instantiated in particular on the basis of a programmatic class model such as that below, the arrows and indents indicating a legacy relationship:

Technical Installation
   →Components
   →Parameters
   →States
   →Profiles
   →Associated components
   →Coordinates
   →Connections
   →Connected component ports
   →Coordinates
   →Global parameters FIG. 2 shows a control device CTL according to embodiments of the invention for controlling a technical system TS, e.g. an infrastructure network. Where the same reference signs as in FIG. 1 are used in FIG. 2, these reference signs denote the same entities. These entities can be implemented or realized in a functional context of FIG. 2 as described in the context of FIG. 1.

The control device CTL has one or more processors PROC for performing all the method steps of the control device CTL and has one or more memories MEM coupled to the processor PROC for storing the data to be processed by the control device CTL.

The control device CTL is used for controlling the technical system TS. Controlling the technical system TS is intended to be understood in this case to mean in particular also output and use of control-relevant data signals and control signals contributing to controlling the technical system TS. In this respect, the control device CTL can be in the form of an assistance system.

The control-relevant data can comprise in particular control data, forecast data, state data, analysis data, monitoring data and/or classification data that can be used in particular for optimizing operation, monitoring or maintaining the technical system TS and/or for detecting wear or detecting damage.

The control device CTL continually captures operating data BD of the technical system TS that is in the course of operation. The operating data BD can be transmitted from the technical system TS to the control device CTL or captured by the control device CTL in another way, e.g. from a data network or by means of ambient sensors.

The operating data captured can be in particular physical, control-engineering, operative and/or design-dependent operating parameters, operating variables, property data, performance data, effect data, state data, configuration data, system data, prescribed values, control data, sensor data, measured values, surroundings data, monitoring data, forecast data, analysis data and/or other data obtained during operation of the technical system TS and describing an operating state of the technical system TS and/or other data relevant to the operation of the technical system TS. These can be for example data about temperature, pressure, emissions, vibrations, resource consumption, yield, etc. Specifically, in the case of a water mains as the technical system TS, the operating data BD can relate to a flow rate, a flow volume, a pressure, a fill level or a pump performance.

The data model DM comprises, as described above, data components associated with the system components of the technical system TS, which data components are not depicted in FIG. 2 for reasons of clarity, however. As well as that, the data model comprises, as already explained above, simulation model data SMD for simulating the technical system TS and/or its system components. The simulation model data SMD contain particular data and parameters of the system components that are relevant to the simulation, which are stored in the respectively associated data component of the data model DM. The simulation model data SMD in particular represent a current state and dynamic properties of the technical system TS.

The control device CTL furthermore comprises independently operated functional modules FM that access the data model DM common to the functional modules FM independently of one another. The functional modules FM can each be realized on an application-specific basis independently of one another, e.g. for the purpose of specifically controlling water mains or chemical production installations, or else independently of application, provided that the respective functional module is useable across applications.

The functional modules FM in the present exemplary embodiment comprise an interface module IO having an interface to the technical system TS and a simulation module SIM for simulating a dynamic response of the technical system TS in the course of operation. The simulation module SIM implements a simulation model SM for the technical system TS and executes this simulation model SM. The simulation model SM in particular models a physical response of the technical system TS. The simulation is effected on the basis of the simulation model data SMD of the data model DM, which indicate particular states and properties of the technical system TS. The simulation can result in particular in a flow simulation, a logistical simulation and/or an event-based, discrete-time simulation being performed.

Furthermore, the functional modules FM comprise an optimization module OPT for ascertaining an optimized control action for the technical system TS and an output module OUT for outputting control data. The control data output in this case can be in particular data specifying a control action, simulation data, monitoring data, forecast data, state data, manipulated variables, analysis data and/or other control-relevant data, i.e. data contributing to controlling the technical system TS. The control data can be output by the output module in particular to the technical system TS and/or to a user interface of an assistance system. In the first case, the output module OUT can be identical to the interface module IO.

Furthermore, the functional modules FM can comprise a sensor module (not depicted) for capturing sensor data of the technical system TS or one or more evaluation modules (not depicted) for implementing specific data evaluation functions as part of the module design according to embodiments of the invention. Such evaluation modules can also incorporate non-model-based data-analytical functions with little outlay.

The above functional modules FM each have associated functional-module-specific selection data, specifically in the present exemplary embodiment the interface module IO has associated selection data S1, the simulation module SIM has associated selection data S2, the optimization module OPT has associated selection data S3 and the output module OUT has associated selection data S4. The respective selection data S1, S2, S3 and S4 identify and select, for the respective associated functional module IO, SIM, OPT or OUT, specifically and explicitly in each case those data in the data model DM that are intended to be accessed by the respective functional module; i.e. those data that need to be read in from and/or stored in the data model DM. The selection data S1, . . . , S4 can be realized e.g. by address statements, database filters, database query patterns or elements of a model-based description language, such as e.g. XML.

On the basis of the respectively associated selection data S1, . . . , S4, the above functional modules FM each select, in a manner specific to the functional module and independently of one another, model data of the data model DM and thus access the selected model data in selection-data-specific fashion. In this manner, the selection data S1, . . . , S4 can be used to specifically provide, for each functional module FM, the input data thereof as selected model data from the data model DM and the output data of said functional module can be specifically stored in the data model DM as selected model data.

The selection data S1, . . . , S4 are provided by the functional modules FM and/or by a flow controller AS of the control device CTL. The flow controller AS actuates the functional modules FM and in particular stipulates the order of call thereof, i.e. a process flow for the functional modules FM.

In the present exemplary embodiment, the respective selection data S1, S2, S3 and S4 are provided by the respectively associated functional module IO, SIM, OPT or OUT and transmitted therefrom to the flow controller AS in each case. Alternatively or additionally, the selection data S1, . . . , S4 can be entered into a cross-functional-module table (not depicted), from which they can be retrieved by the flow controller AS and/or by a respective functional module FM.

According to a further embodiment, the selection data can be transmitted from the flow controller AS to the functional modules FM. However, only the selection data associated with a respective functional module are transmitted thereto in this case.

The process flow can be controlled by the flow controller AS on a problem-specific and/or application-specific basis. This can be effected in particular on the basis of a control application or a control purpose, on the basis of the selection data or on the basis of the links between the system components and/or the data components. The control application provided for can be e.g. monitoring of the technical system TS, simulation-assisted forecast of future states of the technical system TS or optimization of control actions for controlling the technical system TS.

In the present exemplary embodiment, future states of the technical system TS are supposed to be forecast on a simulation-assisted basis and an optimized control action for controlling the technical system TS is supposed to be ascertained. A process flow corresponding to this control application is indicated in FIG. 2 by dashed arrows.

In this case, the interface module IO continually captures the operating data BD of the technical system TS and stores them in the data model DM by means of selection-data-specific access by means of the selection data S1. In this context, operating data that come from a respective system component of the technical system TS are stored in the data component of the data model DM that is respectively associated with this system component.

The simulation module SIM reads the operating data BD and the simulation model data SMD from the data model DM by means of selection-data-specific access by means of the selection data S2, takes the read operating data BD and the simulation model data SMD for simulating the dynamic response of the technical system TS by means of the simulation model SM and, as a result, ascertains a future state of the technical system TS, among other things. As a result, the simulation module SIM stores simulation data SD about the ascertained dynamic response and about the future state of the technical system TS in the data model DM by means of selection-data-specific access by means of the selection data S2. The simulation data SD in this case also comprise specific state data ST about the future state of the technical system TS. If the simulation module SIM also ascertains a future state, it also acts to a certain extent as a forecast module. Alternatively or additionally, the functional modules FM can comprise a separate forecast module for ascertaining the future state.

To optimize control of the technical system TS, the optimization module OPT generates a multiplicity of different, potentially performable control actions for the technical system TS. For the generated control actions, the optimization module OPT ascertains a respective dynamic response of the technical system TS, induced thereby, on the basis of the simulation model SM or on the basis of a separate physical model of the technical system TS and on the basis of the operating data BD. A respective induced dynamic response is rated by the optimization module OPT according to a prescribed criterion. On the basis of these ratings, that control action OSA that optimizes the prescribed criterion is selected from the generated control actions. The criterion used can relate to e.g. an efficiency, a yield, a resource consumption and/or a wear on the technical system TS. The selected control action OSA is stored in the data model DM by the optimization module OPT by means of selection-data-specific access by means of the selection data S3.

The output module OUT reads the simulation data SD with the state data ST and the optimizing control action OSA from the data model DM by means of selection-data-specific access by means of the selection data S4 and outputs the simulation data SD with the state data ST and the optimizing control action OSA to control the technical system TS.

The use of independently usable functional modules FM accessing a common data model DM allows the control device CTL to be matched to different applications particularly easily. On account of the independence of the functional modules FM, they can be restructured or recompiled with little outlay. This can be effected in particular on the basis of application information transmitted to the control device CTL. Said application information can specify in particular an intended application, such as e.g. monitoring, forecast or optimization of the technical system TS. As well as that, the functional modules FM can also be embodied as microservices in edge computing environments or cloud computing environments.

The modularization structure according to the invention allows a multiplicity of available software functionalities, software libraries and software methods to be used in an advantageous manner, which means that an implementation and adaptation outlay for such control devices can be lowered considerably.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for controlling a technical system having multiple functionally linked system components, the method comprising:
 a) accessing a common data model by multiple independently operable functional modules, wherein:
  the functional modules comprise an interface module having an interface to the technical system, a simulation module and an output module, and
  the common data model comprises linked data components associated with the functionally linked system components and simulation model data for a simulation model of the technical system;
 b) actuating the functional modules by a flow controller, the flow controller and a respective functional module having selection data associated with the functional module transmitted between them that the respective functional module takes as a basis for selecting model data of the common data model and for accessing the selected model data;
 c) continuously capturing, by the interface module, operating data of the technical system and storing the operating data in the common data model by means of selection-data-specific access;
 d) reading, by the simulation module, the operating data and simulation model data from the common data model by means of selection-data-specific access, which takes the read operating data and the simulation model data as a basis for ascertaining a dynamic response of the technical system and stores simulation data about the ascertained dynamic response in the common data model by means of selection-data-specific access; and
 e) reading, by the output module, the simulation data from the common data model by means of selection-data-specific access and outputting the simulation data to control the technical system.

2. The method as claimed in claim 1, wherein the common data model is provided by virtue of an unparameterized data model with data components associated with the system components and accordingly linked being parameterized on the basis of system parameters of the system components.

3. The method as claimed in claim 1, wherein the functional modules are actuated by the flow controller on the basis of the selection data and/or on the basis of the link of the data components.

4. The method as claimed in claim 1, wherein the dynamic response is simulated in the course of operation of the technical system, and
 in that the functional modules comprise a monitoring module that takes the simulation as a basis for ascertaining a state of the technical system and outputs state data about the ascertained state to control the technical system.

5. The method as claimed in claim 4, wherein the monitoring module is a forecast module that takes the simulation as a basis for ascertaining a future state of the technical system and outputs state data about the ascertained future state to control the technical system.

6. The method as claimed in claim 1, wherein the functional modules comprise an optimization module,
 that generates different control actions for the technical system,
 ascertains for the different control actions a respective dynamic response of the technical system, induced thereby, on the basis of the simulation model, and
 outputs a control action from the generated control actions that optimizes the induced dynamic response to control the technical system.

7. The method as claimed in claim 1, wherein the flow controller ascertains an order in which functional modules are called,
 on the basis of a control application and/or
 on the basis of a temporal, spatial, logical and/or functional link or on the basis of system components, system processes or system data of the technical system and/or applicable data components and/or data records of the data model.

8. The method as claimed in claim 1, wherein the functional modules comprise a sensor module that stores sensor data relating to the technical system in the common data model by means of selection-data-specific access.

9. The method as claimed in claim 1, wherein the functional modules comprise an evaluation module that reads data to be evaluated as part of the control from the common data model by means of selection-data-specific access and evaluates said data and stores an evaluation result in the common data model by means of selection-data-specific access.

10. The method as claimed in claim 1, wherein one or more of the functional modules each run as a microservice in an edge computing environment and/or cloud computing environment.

11. The method as claimed in claim 1, wherein application information specifying a control application is read in, and the read-in application information is taken as a basis for, in each case,
- restructuring the data model,
- modifying the selection data and/or
- actuating the functional modules by means of the flow controller.

12. An arrangement for controlling a technical system, set up to perform a method as claimed in claim 1.

13. A computer program product set up to perform a method for controlling a technical system having multiple functionally linked system components, the method comprising:
- accessing a common data model by multiple independently operable functional modules, wherein:
  - the functional modules comprise an interface module having an interface to the technical system, a simulation module and an output module, and
  - the common data model comprises linked data components associated with the functionally linked system components and simulation model data for a simulation model of the technical system;
- actuating the functional modules by a flow controller, the flow controller and a respective functional module having selection data associated with the functional module transmitted between them that the respective functional module takes as a basis for selecting model data of the common data model and for accessing the selected model data;
- continuously capturing, by the interface module, operating data of the technical system and storing the operating data in the common data model by means of selection-data-specific access;
- reading, by the simulation module, the operating data and simulation model data from the common data model by means of selection-data-specific access, which takes the read operating data and the simulation model data as a basis for ascertaining a dynamic response of the technical system and stores simulation data about the ascertained dynamic response in the common data model by means of selection-data-specific access; and
- reading, by the output module, the simulation data from the common data model by means of selection-data-specific access and outputting the simulation data to control the technical system.

14. A non-transitory computer-readable storage medium storing instructions, which when executed by a processor, perform a method for controlling a technical system having multiple functionally linked system components, the method comprising:
- accessing a common data model by multiple independently operable functional modules, wherein:
  - the functional modules comprise an interface module having an interface to the technical system, a simulation module and an output module, and
  - the common data model comprises linked data components associated with the functionally linked system components and simulation model data for a simulation model of the technical system;
- actuating the functional modules by a flow controller, the flow controller and a respective functional module having selection data associated with the functional module transmitted between them that the respective functional module takes as a basis for selecting model data of the common data model and for accessing the selected model data;
- continuously capturing, by the interface module, operating data of the technical system and storing the operating data in the common data model by means of selection-data-specific access;
- reading, by the simulation module, the operating data and simulation model data from the common data model by means of selection-data-specific access, which takes the read operating data and the simulation model data as a basis for ascertaining a dynamic response of the technical system and stores simulation data about the ascertained dynamic response in the common data model by means of selection-data-specific access; and
- reading, by the output module, the simulation data from the common data model by means of selection-data-specific access and outputting the simulation data to control the technical system.

* * * * *